INVENTOR.
HERBERT F. MATARÉ
BY Richard T. Seeger
ATTORNEY

INVENTOR.
HERBERT F. MATARE'
BY
Richard J. Seeger
ATTORNEY 3,171,042
Patented Feb. 23, 1965

3,171,042

DEVICE WITH COMBINATION OF UNIPOLAR MEANS AND TUNNEL DIODE MEANS

Herbert F. Mataré, Birmingham, Mich., assignor to The Bendix Corporation, Southfield, Mich., a corporation of Delaware Filed Sept. 8, 1961, Ser. No. 136,886
10 Claims. (Cl. 307—88.5)

This invention pertains to a semiconductor device and more particularly to a three terminal tunnel diode.

Recently the tunnel diode, in which majority carriers "tunnel" through the forbidden energy band of a very narrow junction, has been developed and is possible of very fast carrier transport processes. Tunnel diodes have proved useful for switching circuits, frequently converters, oscillators, amplifiers and a variety of other high fequency devices. However, the diode is limited in its applications due to the fact that it is a two terminal device and that it is difficult to isolate the input and output terminals. It has led, therefore, to complicated circuits having the disadvantage of bulkiness and high cost.

Also known in the art is the field effect or unipolar semiconductor devices which have a source electrode forming a rectifying contact with a semiconductor body and a drain electrode forming an ohmic contact with the body; a gate electrode forms a rectifying contact with the body and is placed in such a position so as to create a field which essentially narrows the carrier path between the source and the drain in the semiconductor body to control the number of carriers and hence the amount of current. Such a device is shown in the Patent No. 2,970,-229, issued January 31, 1961, to H. F. Mataré et al. The control of the current through the semiconductor body by varying the voltage on the gate potential is known to have very high speed capability and low noise.

This invention provides a tunnel triode by combining the advantages of the tunnel diode with a field effect device which provides operation at low power level, low noise, large bandwidth capability, good tolerance to temperature variations, and very high speeds, with the provision of a third terminal for controlling the current flow through the triode. In a preferred embodiment this is accomplished by forming a tunnel junction at the drain of a field effect device.

Also, the device of this invention forms a simple "non-destructive readout" member which gives indication of which stable position the triode is in without changing the stable position. This is important in computer work.

Figure 1:
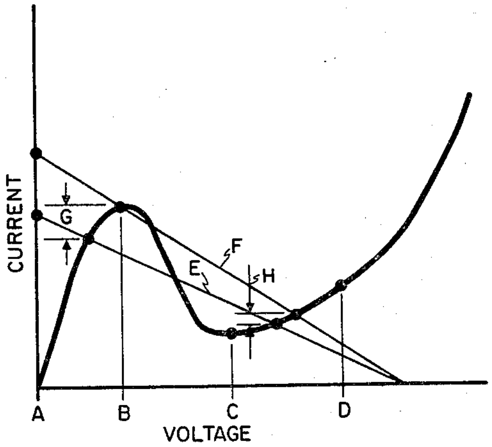
Figures 2, 2A, 3, 6:
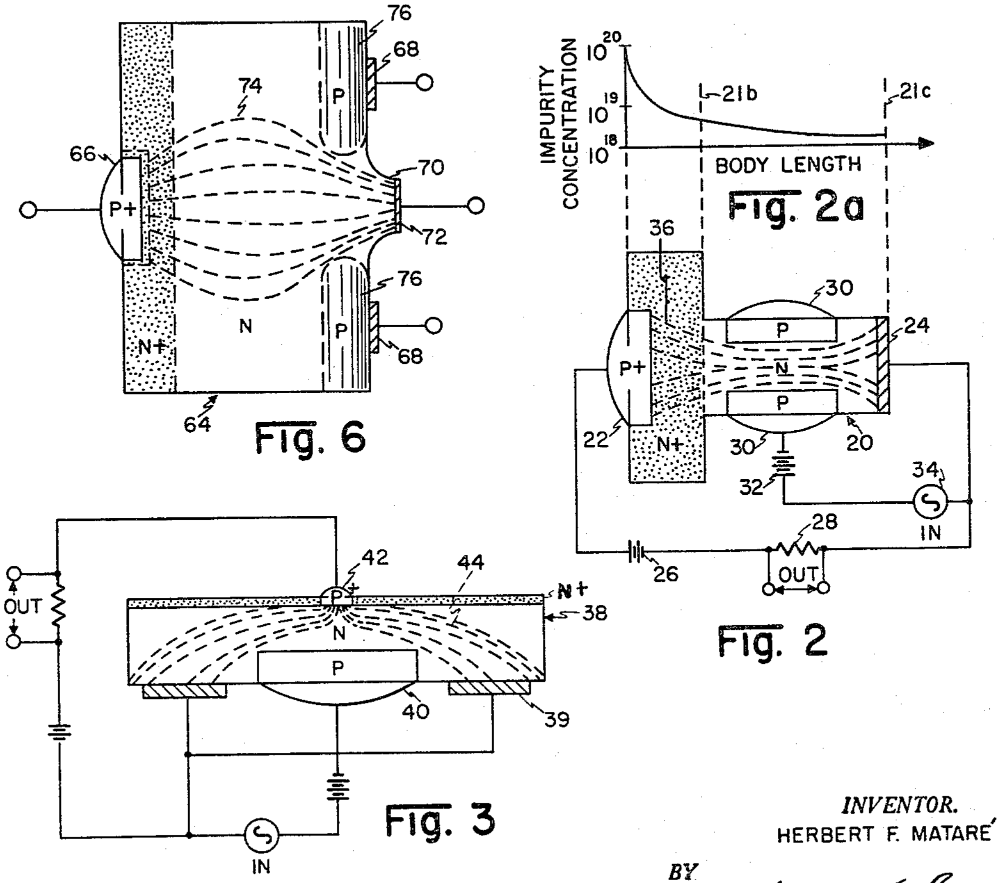
Figures 4, 5:
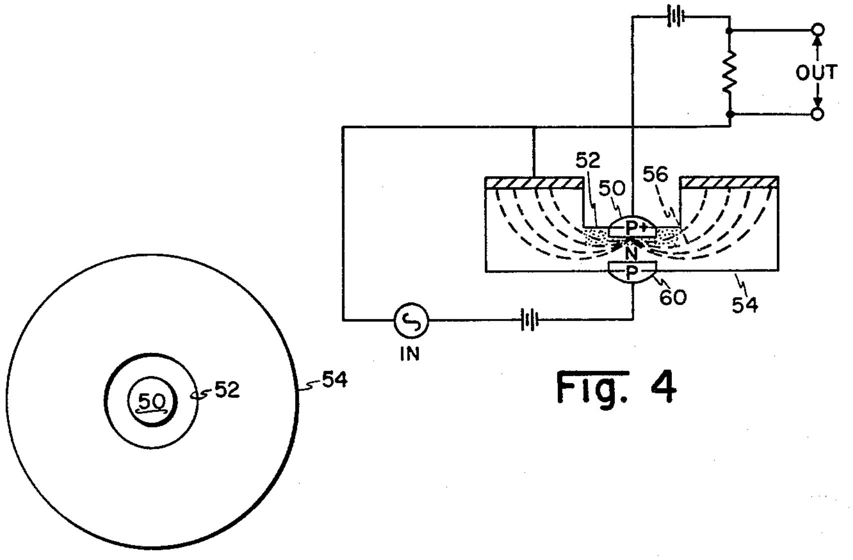

The above mentioned objectives and other will become more apparent when preferred embodiments are discussed in connection with the drawings in which:

FIGURE 1 is a current-voltage plot of a tunnel triode;

FIGURES 2, 3, 4, 6 and 7 being schematic sectioned diagrams of various embodiments of this invention, FIGURE 2*a* being an impurity concentration plot of the device of FIGURE 2 and FIGURE 5 being a plan view of FIGURE 4.

The doping of the various components will be as indicated in the drawings but may be reversed for particular applications.

The first embodiment shown in FIGURE 2 will be explained with the aid of FIGURES 1 and 2*a*. In FIGURE 2 is shown a semiconductor body 20 having N-type doping in the proportion shown in FIGURE 2*a* where the ordinate is the number of impurity atoms or molecules per cubic centimeter and the abscissa is the length of the semiconductor body. It is seen that in this embodiment towards the left end of the semiconductor body 20, the impurity concentration is $10^{20}$ impurity atoms per cubic centimeter. The curve drops rather sharply and then gradually levels off to about $5 \times 10^{18}$ impurity atoms per cubic centimeter in this instance.

Alloyed to the left end of the semiconductor body 20 having the high concentration of N-type impurity atoms is a drain electrode 22 having a high P-type impurity concentration of $10^{20}$ atoms per cubic centimeter, to form a tunnel rectifying junction. A source electrode 24 is nickel plated to body 20 forming an ohmic contact with body 20.

In the source-drain circuit is bias battery 26 and load or output resistor 28. Connected around the periphery of body 20 is gate electrode 30, which encircles body 20 and is of P-type doping having an impurity of about $10^{18}$ impurity atoms per cubic centimeter and forms a rectifying junction with body 20. Included in the gate circuit is bias battery 32 and input 34.

The material of body 20 may be silicon or germanium and the impurity doping may be of the standard type. The carrier distribution lines are shown by dotted lines 36 and as the potential to gate 30 is increased, the available area through which the carriers may travel is progressively narrowed or pinched thereby reducing the carrier flow and the voltage drop across resistor 28.

Preferably the internal resistance of body 20 is chosen so that it will not offset the negative portion of a typical tunnel diode voltage current curve as shown in FIGURE 1. This means that the voltage drop across body 20 should be sufficiently small so that it will not be greater than the absolute amount of the negative resistance of the tunnel portion of the device. This is accomplished in part by providing a substantially large area in body 20 in the higher resistance portion, that being the portion between lines **21*b* and 21*c*, to reduce the overall resistance through the body 20**.

The frequency response of the device shown in FIGURE 2, and in the subsequent devices to be later explained, is very high since the gate 30 has a capacitive action that has been shown to have very high frequency response and the highly doped tunnel junction between source 22 and the body 20 has a very high frequency response, also shown previously.

In this invention, as shown in FIGURE 2, carriers tunnel through the rectifying junction between drain 22 and body 20 and move along carrier paths 36. The number of carriers is controlled by controlling the voltage to gate 30 which sets up a field effect narrowing or pinching the carrier paths when the field and carriers are of like sign.

The non-destructive readout will be explained with the aid of FIGURE 1. Shown along the ordinate of FIGURE 1 is the current output and along the abscissa, the voltage placed across the tunnel triode. For low voltage portion of the curve, from A to C, transmission is by tunnel process and the later portion at point C, transmission is by the injection process. The triode is designed to operate in the area of A to D. Lines E and F represent equivalent resistance lines for two different gate voltages and the operating points of the tunnel triode are determined by the points of intersection between lines E and F and the triode curve.

In computer work it is often desirable to know whether the tunnel device is operating along the portion between A and B or the portion between C and D of the triode curve, those being two stable portions of the curve. By stable portions is meant those portions at which a given current-voltage relationship can be maintained. The negative resistance portion from B to C is unstable since an operating point in this portion of the curve cannot be maintained and will move to one of the stable portions on either side.

In the past it has been difficult to determine at what stable portion along a given resistance lines (E or F) a tunnel device was operating without changing it from one stable portion to another so that if the tunnel device was at a point in part A to B of the curve, the only way to determine this would be to put sufficient voltage on the diode to move the stable point over to part C to D.

In this invention, the stable portion at which the transistor is operating can be determined merely by varying the gate voltage and noticing whether there is a large increment of current change G, or a small increment of current change H, with the former denoting that the operation is on the A to B portion of the curve and the latter denoting that the operation is on the C to D portion of the curve. In this manner, non-destructive readout is provided very simply and with a single unit.

Further, where it was required in the past to use both a tunnel diode and a resistor to provide a memory device, this now can be provided in a single unit, that being as shown in FIGURE 2, making a more compact package which is of course also desirable in computer work.

The embodiment in FIGURE 3 is of improved geometrical form and transconductance. Here a source contact 39, which forms an ohmic contact with body 38, is ring shaped and surrounds a gate junction 40. The drain 42 forms a tunnel rectifying junction with the body 38 so that carrier paths 44 pass through a relatively narrow area adjacent gate 40. The width of path 44 is more sensitive to the gate potential with this construction. The rectifying contacts between drain 42 and body 38 and between gate 40 and body 38 are alloyed but one may also get improved device characteristics by using epitaxial layers for the tunnel junction since low ohmic material, which is desirable for tunnel junction areas, may be deposited on higher ohmic material, which is desirable for the field effect region of the transistor.

FIGURES 4 and 5 show the detail of a structure which can be be made for more established procedures such as alloying the diffusion. The P-type tunnel drain 50 is alloyed to the dimple 52 of a normally doped germanium wafer 54 of doping concentration of about $10^{17}$ to $10^{18}$ impurity atoms, such as arsenic, per cubic centimeter. A masking is applied to the outer ring while a diffusion process is used to form the highly doped layer 56 to which is joined tunnel drain 50. This may be achieved also by masking and diffusion of a hole to get the desired concentration of impurities then etching the center portion 52. Ohmic contacts are then applied to the outer circumference of the tunnel diode, forming the source electrode 58. The gate electrode is a small P-type dot 60 alloyed to the side of the N-type wafer 54 opposite to the dimple and drain 50.

This device is designed to include higher frequency limit due to the fact that the gate contact can be made very small resulting in lower capacitance and a lower time constant. Also, the placement of the gate contact lends itself to an increase in heat dissipation and an increase in power handling by the device.

A more refined version especially suitable for silicon because oxide masking has been developed for Si and not Ge is shown schematically in FIGURE 6. A crystal 64 is doped at the left end to a concentration of about $5\times10^{19}$ impurity atoms per cubic centimeter with a highly doped drain dot 66 being alloyed thereto to form a tunnel junction. The right end of the crystal doping remains at approximately $10^{18}$ impurity atoms per cubic centimeter to which is applied a gate ring 68 which is formed to crystal 64 with a rectifying junction. The gate junctions are not specifically used to perform transistor action and injection of minority carriers into the wafer, but are used to sense the operation of the tunnel diode by noticing the voltage change for a given current change and to make it possible to control the current flow in this device in a defined way with extremely short relaxation or sensing time. The gates are used as variable capacitors with very short time constants in the change in capacity due to the change in potential at these junctions and when negligible current is flowing.

The device of FIGURE 6 is of the "mesa" type. Manufacture of this device would be similar to the preparation of usual silicon "mesa" devices as they are on the market or especially one type of device which is known as the switching transistor of Salow. The processing would be as follows:

The left side of the silicon wafer 64 is doped to about $10^{18}$ impurity atoms per cubic centimeter, and then subjected to a diffusion with an impurity content substance which would give the desired region for a junction for the tunnel dot 66. After this diffusion, another diffusion is made to the opposite or right side of the wafer avoiding a central region at 70 which could be protected by a photoresist method known to the art. The diffusant could be boron in the case for an N-type silicon wafer.

The right side of the wafer is then etched, with the central region protected by the photo resist or other methods. After etching, the central region protected by the photo-resist protective layer will remain elevated, and a "mesa" structure will be formed to which is connected by an ohmic junction source 72. The operation of the device of FIGURE 6 will now be described.

The tunnel junction on the left side would force a current flow into the base or source contact 72 which is the non-diffused region. The current flow lines 74 would pass in the center of the circular field 76 provided by circular gate 68. The potential change at the gate 68 affects the source-drain current with the speed of light as long as carrier storage is not involved. Therefore, full utilizaiton of speed could be maintained.

Figure 7:
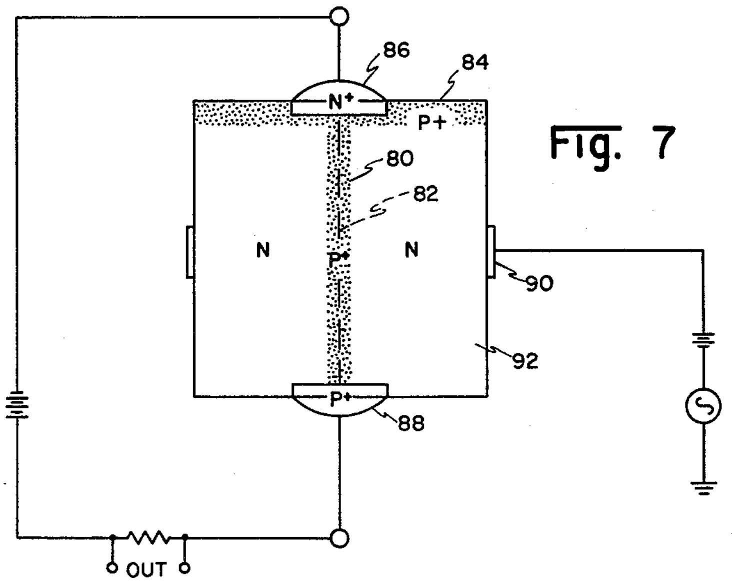

Another proposal is shown in FIGURE 7. Here the use of grain boundaries as high conductive and temperature insensitive current pathways 80 is made. In this structure, a bi-crystal has a grain boundary 82. To form the grain boundary 82 the following general procedure may be used. First, grow bi-crystals of a certain amount of misfit, generally below 20° of tilt with high doping as used in bi-crystal photo devices. Second, apply diffusion to one side of the bi-crystal to provide the necessary tunnel atmosphere. A gallium diffusion on one side of the bi-crystal layer of approximately $5\times10^{19}$ per cc. concentration should be sufficient for placing a good tunnel junction right in this area. This is discussed in U.S. Patent No. 2,970,229 of Mataré et al., issued January 31, 1961.

It is known that the bi-crystal interface conduction is rather independent of temperature. It is also known that the doping of such bi-crystals can proceed to a very high degree, say up to $5\times10^{17}$ impurity particles per cubic centimeter and higher, without changing the junction properties at the grain boundary interface. In other words, we have rectifying junctions even down to a range of as low as $\frac{1}{100}$ ohm centimeter in the base material. See e.g. H. F. Mataré and O. Weinreich in Solid State Physics, Proceedings International Conference, Brussels, Academic Press, 1960, pp. 73–108. This device could be produced in the following manner.

A tunnel junction 84 for drain dot 86, which may be gold antimony or lead antimony, could be applied to one side of the grain boundary 82 layer and an indium contact 88 for a source electrode or base electrode would be applied to the other side of the grain boundary layer. In this case the tunnel junction 84 is made by N-type material, for instance with gold antimony or lead antimony alloy. A circular gate electrode 90 forms an ohmic contact with a circular N-type impurity material 92 doped to $10^{17}$–$10^{18}$ impurity particles per cubic centimeter, which forms a rectifying junction with bi-crystal 82. The drain 88 has a blocking voltage towards the N-type gate material 92 and is in ohmic contact to the grain boundary sheet. In this way the conducting channel path would lead through the grain boundary and could be subjected to sensing voltage changes or capacity changes along this junction, as was demonstrated in the use of the field-effect devices in the above cited Mataré et al. patent. The device of FIGURE 7 would operate in the following manner.

Majority carriers move across the tunnel junction gap at source 86 and convene at the grain boundary of the bi-crystal layer 82 and are carried through to the indium drain contact at the other side. The conductance through the grain boundary 82 would be modulated by the gate 90 potential which would change the number of holes assembled along the grain boundary sheet.

These gate electrodes would be very simple to manufacture since it is known from the work on grain boundary field-effect transistors that very simple copper, nickel, or gold or other contacts of general ohmic nature on these bi-crystal halves are sufficient to carry very small current densities for the sensing or gate exploration.

The grain boundary conduction noise, which contributes mainly to the output channel noise here carrying the tunnel diode, is very small due to the high conductivity in the sheet of this layer. Also such a device is completely independent on temperature since the grain boundary field-effect device has been demonstrated to be practically temperature independent due to the high doping of the bi-crystal material. Therefore, this device, as shown in FIGURE 7, is a combination of a field-effect transistor using dislocation planes and a tunnel diode. This combination device might prove to be a temperature independent transistor with very low noise contribution amplifying into the range of liquid helium temperature.

Although this invention has been disclosed and illustrated with reference to particular applications, the principles involved are susceptible of numerous other applications which will be apparent to persons skilled in the art. For example, desirable results are obtained when a device having a separate tunnel diode is connected to a separate unipolar transistor. The invention is, therefore, to be limited only as indicated by the appended claims.

Having thus described my invention I claim:

1. A semiconductor device comprising at least one source contact, a body of semiconductor material, a drain contact, at least one gate contact, said drain contact forming a tunnnel rectifying junction with said body, the doping on one side of said tunnel junction being at least $10^{18}$ impurity particles per cubic centimeter and at least $10^{19}$ impurity particles per cubic centimeter on the other side of the junction, and in all cases said doping being sufficient to provide primary carrier flow by the tunnel mechanism, said gate contact forming a rectifying junction with said body, said source contact forming an ohmic junction with said body, control voltage means being connected to said gate contacts, a load member being connected to said drain contact to receive the majority carrier flow from said drain contact.

2. The device of claim 1 wherein said source contact is at one end of said body and said drain contact is at the opposite end of said body, said gate contact being intermediate of said source and drain contact.

3. The device of claim 2 wherein said gate contact surrounds the periphery of said body.

4. The device of claim 1 wherein said body is a wafer having opposite closely spaced sides, said source contact being on one side of said body and said gate contact and drain contacts are at another side of said body.

5. The device of claim 4 wherein said gate contact forms an enclosed path around said drain contact on said other side.

6. The device of claim 1 wherein said body has a depression in one side thereof, said source contact being at said depression, said drain contact being on said one side and encircling said depression, said gate contact being on the side opposite to said one side and directly opposite to and in close proximity to said source contact.

7. The device of claim 1 wherein said source contact is on one side of said body, a mesa being formed on the side opposite to said one side, said drain contact being on said mesa, said gate contact being on said opposite side of said body.

8. The device of claim 7 wherein said gate contact on said opposite side encircles said drain contact.

9. The device of claim 1 wherein said body is a bi-crystal consisting of two semiconductors of one conductivity type and having their grains at a predetermined tilt angle, yielding a medium angle of misfit grain boundary plane.

10. A semiconductor device comprising tunnel junction means, unipolar means having a drain contact, said unipolar means being connected to said tunnel junction means to control the output of said tunnel junction means and provide a high frequency low noise semiconductor device, said tunnel junction means having a tunnel junction in a semiconductor material, the doping in said semiconductor material being sufficient to provide carrier flow primarily by the tunnel mechanism, a load member being connected to said drain contact to receive the majority carrier flow from said drain contact.

References Cited in the file of this patent

UNITED STATES PATENTS

| | | |
|---|---|---|
| 2,778,956 | Dacey et al. | Jan. 22, 1957 |
| 2,945,374 | Jones | July 29, 1958 |
| 2,952,804 | Franke | Sept. 13, 1960 |
| 2,970,229 | Mataré et al. | Jan. 31, 1961 |
| 2,974,236 | Pankove | Mar. 7, 1961 |
| 3,033,714 | Ezaki et al. | May 8, 1962 |

OTHER REFERENCES

Publ. I, Handbook of Semiconductor Electronics, Hunter.

Pub. II, Static Relays, Blake.